United States Patent
Wu et al.

(10) Patent No.: US 7,206,227 B1
(45) Date of Patent: Apr. 17, 2007

(54) ARCHITECTURE FOR ASSISTED-CHARGE MEMORY ARRAY

(75) Inventors: Chao-I Wu, Tainan (TW); Ming Hsiu Lee, Hsinchu (TW); Ming-Chang Kuo, Changhua (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 11/326,855

(22) Filed: Jan. 6, 2006

(51) Int. Cl.
*G11C 11/34* (2006.01)

(52) U.S. Cl. .................................. 365/185.05; 365/63
(58) Field of Classification Search .......... 365/185.05, 365/63
See application file for complete search history.

(56) References Cited

U.S. PATENT DOCUMENTS 6,011,725 A    1/2000 Eitan
6,969,662 B2*  11/2005 Fazan et al. ............ 365/185.04
7,136,306 B2*  11/2006 Xue et al. ............... 365/185.28

OTHER PUBLICATIONS

C.C. Yeh, et al., "Phines: A Novel Low Power Program/Erase, Small Pitch, 2-Bit per Cell Flash Memory", 2002 IEEE, IEDM 931-934.
Jan Van Houdt, et al., "Analysis of the Enhanced Hot-Electron Injection in Split-Gate Transistors Useful for EEPROM Applications", IEEE Transactions on Electron Devices, vol. 39, No. 5, May 1992.

* cited by examiner

*Primary Examiner*—Tuan T. Nguyen
(74) *Attorney, Agent, or Firm*—Baker & McKenzie LLP

(57) ABSTRACT

An Assisted Charge (AC) Memory cell includes a transistor that includes, for example, a p-type substrate with an n+ source region and an n+ drain region implanted on the p-type substrate. A gate electrode can be formed over the substrate and portions of the source and drain regions. The gate electrode can include a trapping layer. The trapping layer can be treated as electrically split into two sides. One side can be referred to as the "AC-side" and can be fixed at a high voltage by trapping electrons within the layer. The electrons are referred to as assisted charges. The other side of can be used to store data and is referred to as the "data-side." The abrupt electric field between AC-side and the data-side can enhance programming efficiency.

20 Claims, 11 Drawing Sheets

ARCHITECTURE FOR ASSISTED-CHARGE MEMORY ARRAY

BACKGROUND

1. Field of the Invention

The present invention relates generally to semiconductor memory devices and more particularly to semiconductor memory devices that include an assisted charge.

2. Background of the Invention

Traditional EPROM tunnel oxide (ETOX) flash memory cells and the traditional Nitrided Read Only Memory cells suffer from programming inefficiencies since large currents are generally required to perform a programming operation. ETOX flash and Nitrided Read Only Memory cells are programmed using Channel Hot Electron (CHE) injection to program the cells to a high voltage. Hot electrons are electrons that have gained very high kinetic energy after being accelerated by a strong electric field in areas of high field intensities within a semiconductor device, such as ETOX or Nitrided Read Only Memory semiconductor devices. CHE injection occurs when both the gate voltage and the drain voltage are significantly higher than the source voltage, with $V_g \approx V_d$.

Channel carriers that travel from the source to the drain are sometimes driven towards the gate oxide even before they reach the drain because of the high gate voltage. Injected carriers that do not get trapped in the gate oxide become gate current. The injection efficiency of CHE is small, however, and programming using CHE injection requires large programming current and therefore, CHE injection is inefficient with respect to this wasted current.

Another type of memory cell, a PHINES memory cell, uses Band To Band Hot Hole (BTBHH) injection to program cells to a low voltage. Each PHINES memory cells can store 2 bits per cell. One bit can be stored on the source side of the transistor and one bit can be stored on the drain side of the transistor. In these memory cells each bit can have two states; a high current state that can represent a logic "1" and a low current state that can represent a logic "0". Each side of the memory cell can be read by sensing the current through the cell and determining if the current is higher or lower than a threshold.

The BTB current of an erased cell is higher than the BTB current of a programmed cell. For this reason the state of each side of each cell, programmed or not programmed, can be determined by comparing the current through each side of each cell to a threshold, e.g., a gate to drain or gate to source current threshold.

In a PHINES memory device the charge accumulated on the nitride layer can be erased by a process known as Fowler-Nordheim Injection. During an erase cycle, erase voltages are applied to the source, drain, gate and body of the transistor that cause electrons to tunnel through the bottom oxide barrier of the ONO layer into the nitride layer. These electrons can compensate for the holes injected into the nitride layer during programming. The tunneling through the bottom oxide layer can occur in the presence of a high electric field, created as a result of application of the erase voltages to the transistor, and is a form of quantum mechanical tunneling.

Programming by BTBHH injection can still be too slow, and can require programming times that are too long, for certain applications.

SUMMARY

An Assisted Charge (AC) Memory cell comprises a transistor that includes, for example, a p-type substrate with an n+ source region and an n+ drain region implanted on the p-type substrate. A gate electrode can be formed over the substrate and portions of the source and drain regions. The gate electrode can comprise a trapping layer.

In one aspect, the trapping layer can be treated as electrically split into two sides. One side can be referred to as the "AC-side" and can be fixed at a high voltage by trapping electrons within the layer. The electrons are referred to as assisted charges. The other side can be used to store data and is referred to as the "data-side." The abrupt electric field between AC-side and the data-side can enhance programming efficiency.

These and other features, aspects, and embodiments of the invention are described below in the section entitled "Detailed Description."

BRIEF DESCRIPTION OF THE DRAWINGS

For a more complete understanding of the invention, and the advantages thereof, reference is now made to the following descriptions taken in conjunction with the accompanying drawings, in which.

DETAILED DESCRIPTION

Figure 1:
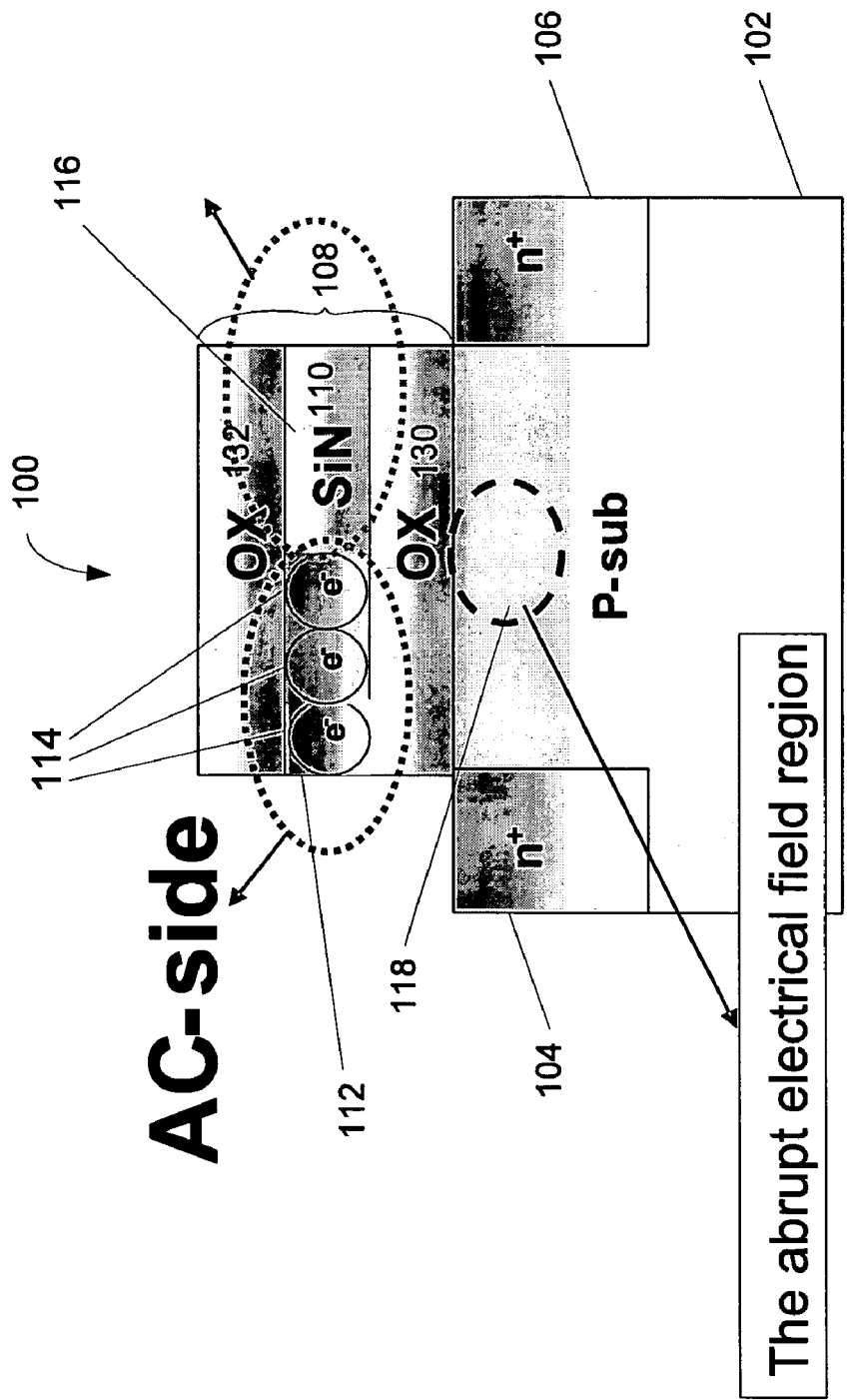
FIG. 1 is a diagram illustrating an example AC-memory device in accordance with one embodiment.

FIG. 1 is a diagram of an Assisted Charge (AC) memory device 100 configured in accordance with one embodiment of the systems and methods described herein. AC-memory device 100 can comprise a transistor that includes a silicon substrate 102. Silicon substrate 102 can serve as a base material that the rest of the memory device 100 can be fabricated on. Two n+ regions 104 and 106 can be created by doping silicon substrate 102. These regions 104 and 106 can act as the source and drain, respectively, for the transistor. An ONO layer 108 can then be deposited on top of silicon substrate 102 between n+ regions 104 and 106. A polysilicon layer (not shown) can be deposited on top of ONO layer 108 to form the gate electrode of the transistor.

ONO layer 108 can include a nitride (N) layer 110 that can trap charge, sandwiched between two silicon oxide layers. For example, electrons that travel upward through the bottom oxide layer can then become trapped within the nitride layer. These electrons can form an assist charge, or be used to store data, as described further below.

Trapping layer 108 can, for example, be split into two sides. One side can be referred to as AC-side 112. AC-side 112 can be fixed at a high voltage by trapping assisted charges 114 in the nitride layer 110. The other side can be referred to as the data side 116 and can be used to store data. The data can be represented by the voltage level stored in the data side 116 and will be described in more detail below.

An abrupt electrical field region 118 can be created between AC-side 112 and data-side 116. This resulting abrupt electrical field can improve programming efficiency by limiting programming current and/or lowering programming times, depending on the embodiment. For example, the high voltage on the AC-side 112 can limit programming current during Hot Electron (HE) programming, as will be described below with respect to FIG. 2A.

Figures 2A, 2B:
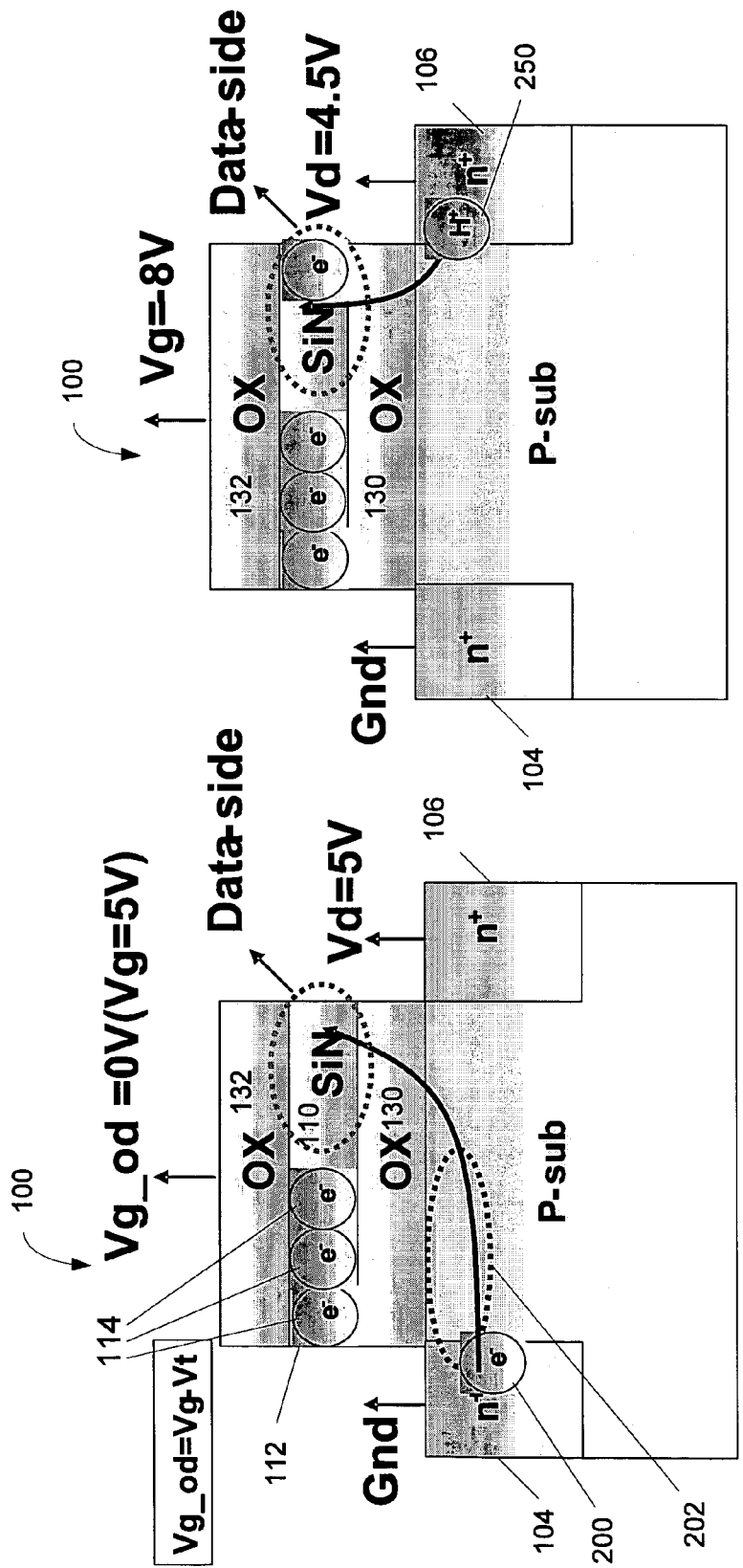
FIG. 2A is a diagram illustrating a method for programming the AC-memory cell of FIG. 1 in accordance with one embodiment.
FIG. 2B is a diagram illustrating a method for erasing the AC-memory cell of FIG. 1 in accordance with one embodiment.

FIG. 2A is a diagram illustrating HE programming of an example AC-memory cell, such as that illustrated in FIG. 1, in accordance with one embodiment of the systems and methods described herein. In a conventional memory cell, a positive voltage on the gate attracts electrons from the p-substrate. These electrons are attracted to the region of the transistor between the source and drain close to the silicon surface. This region is known as the channel. Initially the channel is a non-conducting region; however, when the gate voltage becomes more positively charged, enough electrons are pulled into the channel from the p-substrate to establish a charged path between the source and the drain. Electrons flow across the transistor channel from source to drain and some of these electrons are injected into nitride charge trapping layer 110 through the bottom oxide layer of ONO layer 108. If 0 volts, or low voltage, can be placed on the gate, no electrons, or at least very few, are attracted to the channel and the source and drain are effectively disconnected and little or no current flows across the channel. As a result, few if any electrons are trapped in nitride layer 110.

AC side 112 of AC-memory device 100 is fixed at a high Vt by trapping electrons 114 known as the assisted charge (AC) in layer 110. AC electrons 114 decrease the number of electrons pulled into area 202 of the channel under AC-side 112, since the negative electric charge of these electrons repels electrons in the area 202. This can limit the programming current during HE programming, which reduces the required programming power.

As illustrated in FIG. 2A, when the correct programming voltages are applied, and AC electrons 114 are present, electron 200 can start to flow from source 104 toward drain 106. The flow of electrons can, as described above, be limited by electrons 114 in the AC side 112. In this way the large programming currents that can be required for some conventional devices can be decreased in some implementations. As electron 200 travels from source 104 to drain 106 it will travel through an abrupt electrical field change between AC-side 112 and Data side 116. Some electrons, such as electron 200 will travel through the bottom oxide layer into charge trapping nitride layer 110 on data side 116.

During programming, programming voltages can be applied to gate and drain electrodes, while the source electrode is grounded, or tied to 0 volts. For example, drain 106 and gate 108 can be at 5 volts. It will be understood that different voltages can be used for different implementations.

FIG. 2B is a diagram illustrating an erase operation for an example AC-memory cell, such as that illustrated in FIG. 1, in accordance with one embodiment of the systems and methods described herein. When erasing AC-memory device 100, holes travel from drain 106 to gate and compensate for the electrons trapped in nitride layer 110. Erase voltages can be applied to the gate, drain and source in order to create a voltage difference that will cause holes 250 to flow from drain 106, through oxide layer 130, to nitride layer 110. Holes 250 can compensate for electrons 200 to remove charge from data-side 116. Several of the memory cells can be erased in bulk or by pages or sectors. In this way, the limitations of slower BTBHH can be avoided since many or several cells can be erased at once.

When erasing AC-memory device 100, source 104 can be at ground, drain 106 can be at 4.5 volts, and the gate can be at −8 volts. It will be understood that these are examples of possible voltages that can be used.

Figure 3:
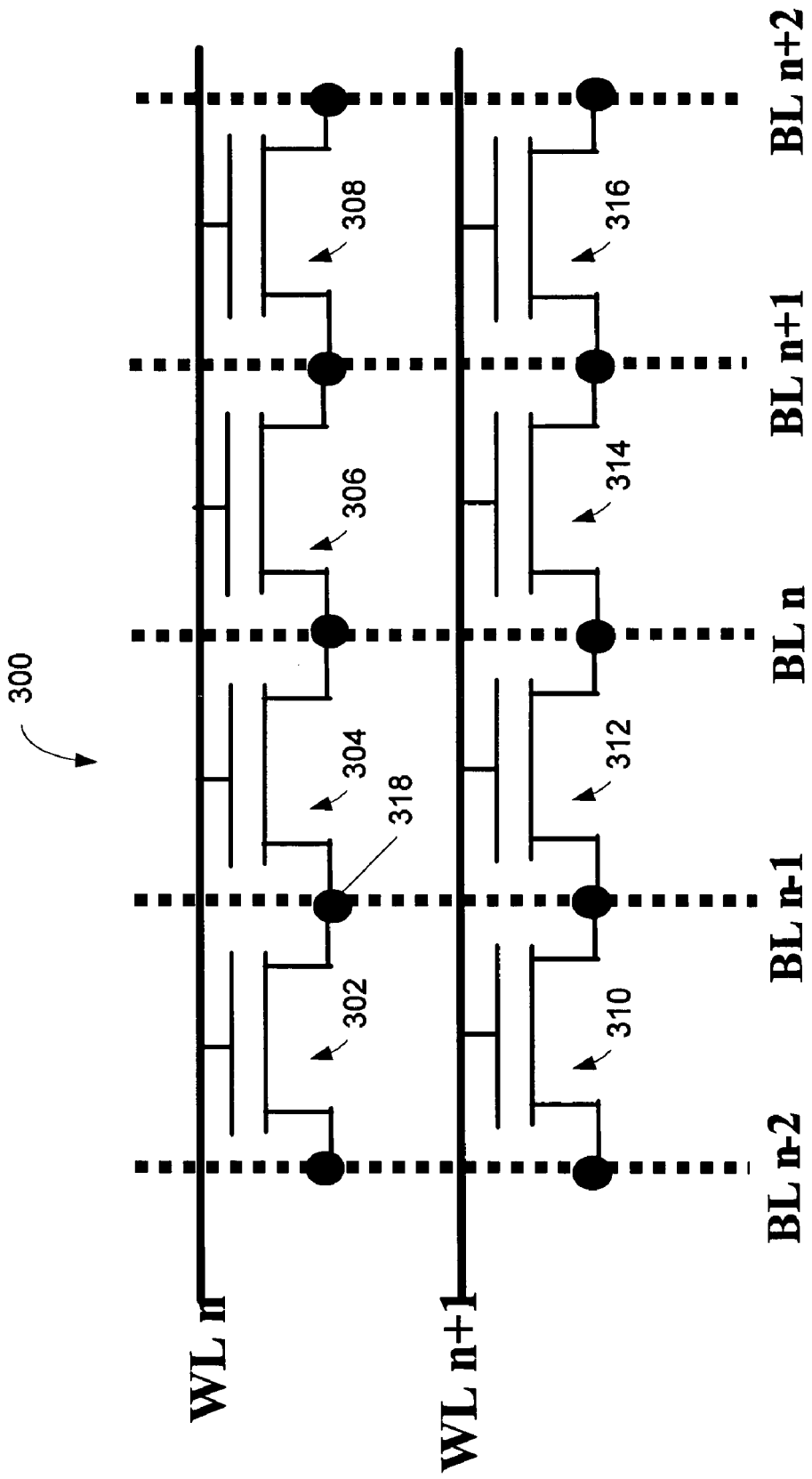
FIG. 3 is a diagram illustrating an example array of AC-memory cells configured in accordance with one embodiment.

FIG. 3 is a diagram illustrating an example array 300 of AC-memory cells 302, 304, 306, 308, 310, 312, 314, and 316. AC-memory cells 302, 304, 306, 308, 310, 312, 314, and 316 can be configured as described in relation to FIGS. 1 and 2. Cells 302, 304, 306, 308, 310, 312, 314, and 316 can be arranged in an array structure, such as the 4×2 array structure of this example. But other array structures comprising more or fewer cells are also possible.

The gates of each cell 302, 304, 306, and 308 that make up AC-memory cells can be connected to Word Line ($WL_n$), while the gates of each cell 310, 312, 314, and 316 that make up AC-memory cells can be connected to Word Line ($WL_{n+1}$). In this way a voltage can be applied to the gate of several cells in an array at one time. Further, each cell 302, 304, 306, and 308 can be connected such that the source from one cell is connected to the drain of another.

For example, the drain of cell 302 can be connected to the source of cell 304 at connection 318. Connection 318 can also connect to Bit Line ($BL_{n-1}$). Bit Lines $BL_{n-2}$, $BL_n$, $BL_{n+1}$, and $BL_{n+2}$, as shown, have similar connections. In this way voltages can be applied to the gates and drains of each of cells 302, 304, 306, and 308. Cells 310, 312, 314, and 316 can be similarly connected. Using the BL and WL connections voltages can be applied to cells 302, 304, 306, 308, 310, 312, 314, and 316 to program or erase each cell 302, 304, 306, 308, 310, 312, 314, and 316. Programming and erasing cells 302, 304, 306, 308, 310, 312, 314, and 316 will be discussed further below with respect to FIGS. 4–11.

Figure 4:
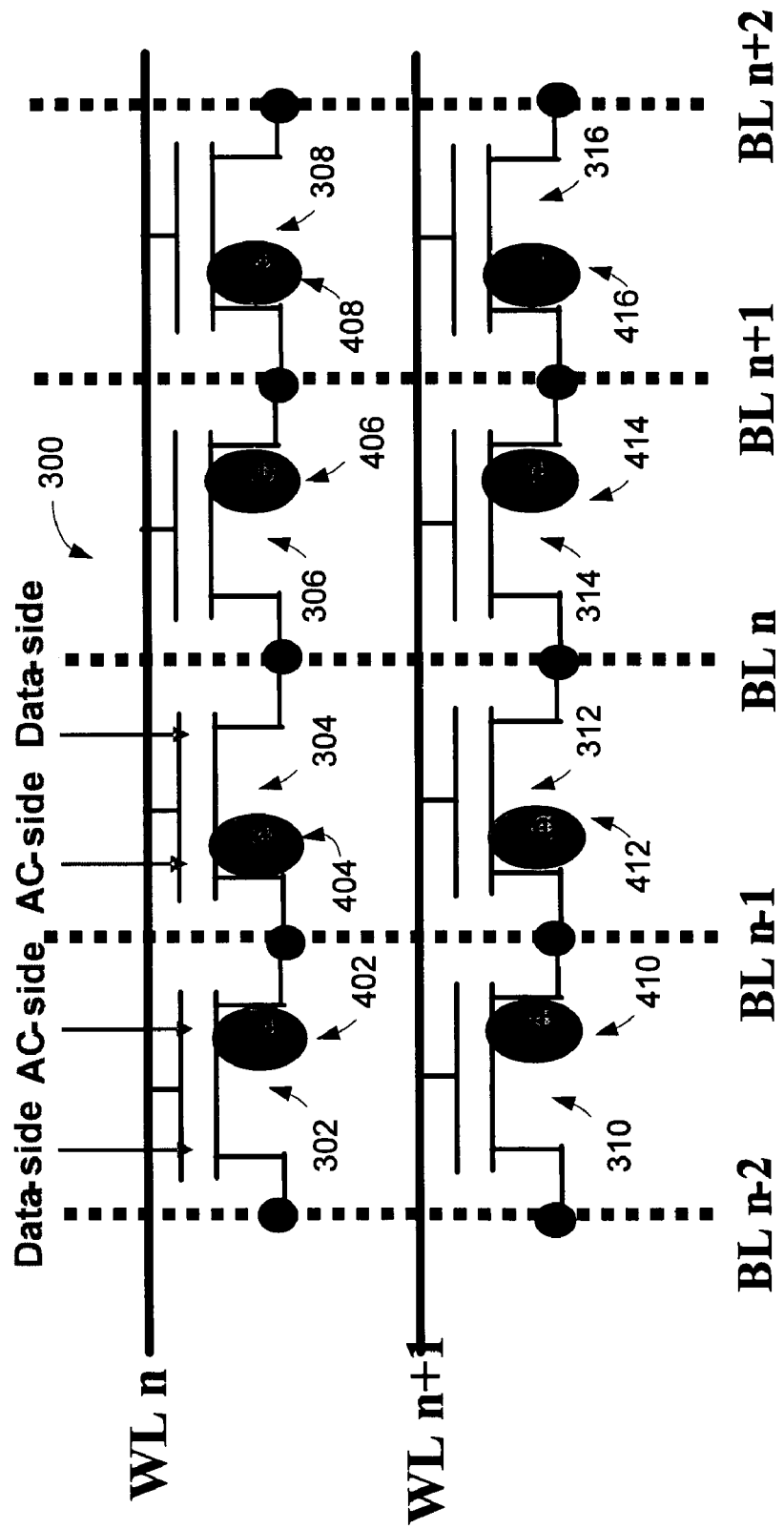
FIG. 4 is a diagram illustrating the array of FIG. 3 with stored assisted charge in each of the AC-memory cells.

FIG. 4 is a diagram illustrating the array 300, wherein an assisted charge is stored in each of the AC-memory cells in array 300. As can be seen, transistors 302, 304, 306, 308, 310, 312, 314, and 316 each have an AC-side and a Data-side, as described with respect to FIGS. 1, 2A, and 2B. The AC-side includes an electron or electrons 402, 404, 406, 408, 410, 412, 414, and 416. Generally many electrons can be used to create a negatively charged region on the AC-side. The number of electrons can vary from implementation to implementation, for example, smaller cells can, in some embodiments require fewer electrons.

In one embodiment the AC-side of one cell can be adjacent to the AC-side of a neighboring cell. For example, cells 302 and 304 have AC-sides 402 and 404 arranged so that they are adjacent to each other. In this example, the AC-side of 302 is on the drain side of cell 308, while the AC-side of cell 304 is on the source side of cell 304. The drain of cell 302 can be connected to the source of cell 304, as illustrated, so that page/sector erases can be performed.

Such page/sector erase operations can, for example, erase the whole device, as discussed below with respect to FIG. 6, or the page/sector operation can erase some portion thereof.

Figure 5:
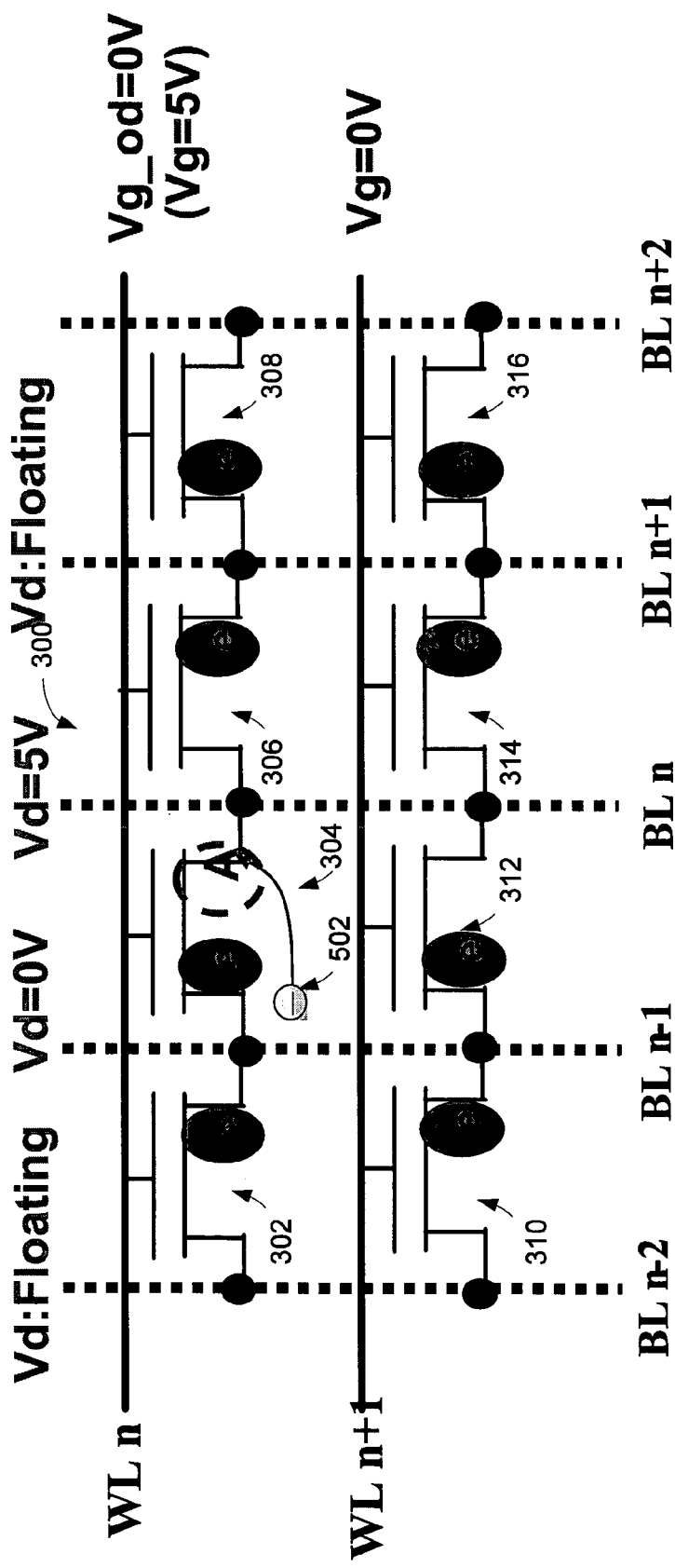
FIG. 5 is a diagram illustrating an example method for programming the array of FIG. 3 in accordance with one embodiment.

FIG. 5 is a diagram illustrating an example method for programming array 300 in accordance with one embodiment of the systems and methods described herein. AC-memory cells within array 300 can be programmed individually, by applying various voltages to the correct WLs and BLs. AC-memory cell 304 can, for example, be programmed by applying 0 volts to $BL_{n-1}$, 5 volts to $BL_n$ and 5 volts to $WL_n$. In this way, cell 304 will have a source voltage of 0 volts, a drain voltage of 5 volts. As was described with respect to FIG. 2A, electrons 502 can start to flow from the source toward the drain and some electrons 502 will travel through the bottom oxide layer into the charge trapping layer on the Data side of cell 304.

During such a programming operation, other BLs can be allowed to float and a voltage of 0 volts can be driven on other WLs. Thus, for example, no current will flow in transistors 302, 306, 308, 310, 312, 314, and 316 while cell 304 is being programmed. Thus, the other cells in array 300 are allowed to, for example, remain un-programmed or retain a previously programmed value.

Note that in the above example and the examples of FIGS. 6–8, 10–12 each bit line voltage shown in the figures is referenced as Vd, a drain voltage. It will be understood that, in the example of FIGS. 3–5, a drain from one cell can, depending on the particular array structure implemented, be connected to the source of another cell. Additionally, depending on the size of the memory device, more or less cells can make up the array structure.

Figure 6:
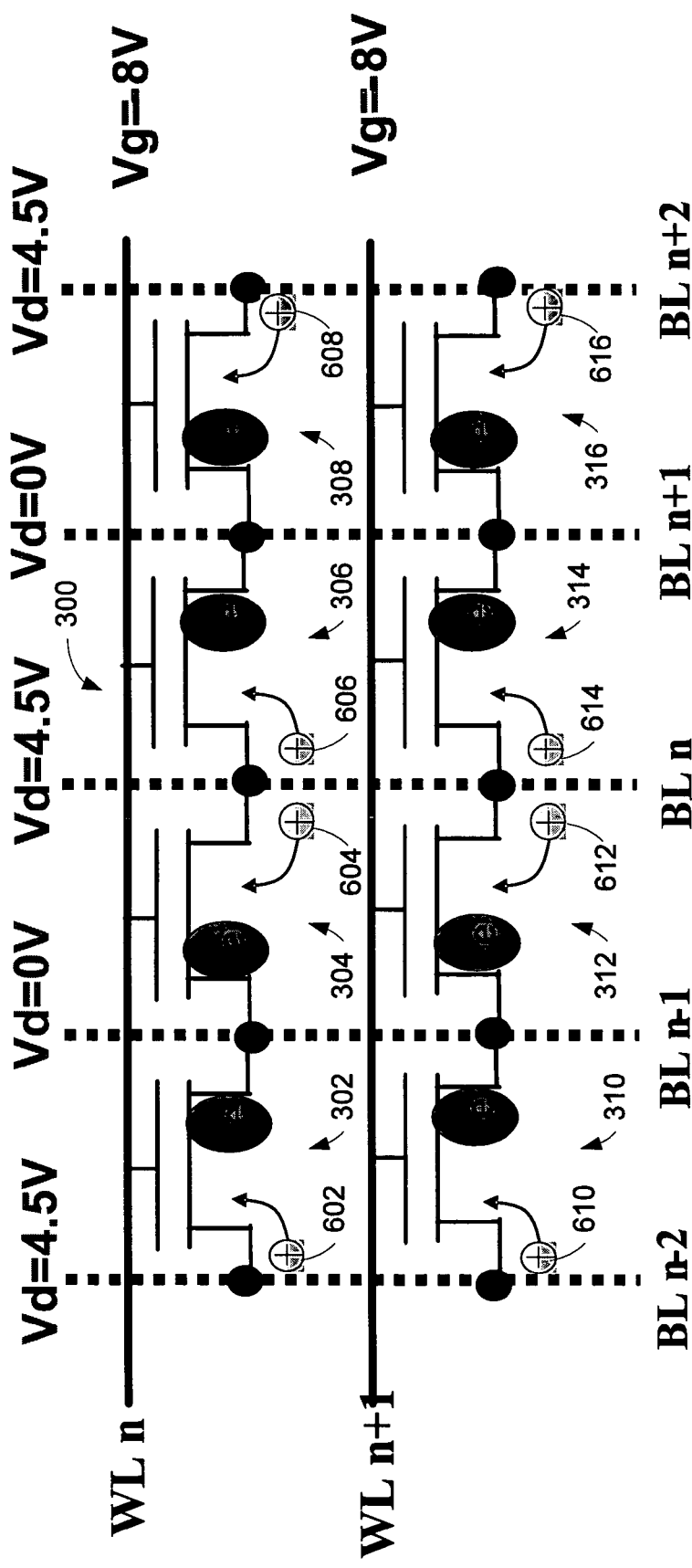
FIG. 6 is a diagram illustrating an example method for a page or sector erase of the array of FIG. 3 in accordance with one embodiment.

FIG. 6 is a diagram illustrating an example method for a page or sector erase of the array of FIG. 3 in accordance with one embodiment of the systems and methods described herein. AC-memory cells within array 300 can be erased by page or sector, e.g., multiple bits at a time, by applying various voltages to the correct WLs and BLs. AC-memory cells 302, 304, 306, 308, 310, 312, 314, and 316 can, for example, be erased at the same time using the process described in relation to FIG. 6.

For example, by applying 0 or 4.5 volts to the correct BLs as shown on FIG. 6, and by applying −8 volts to the appropriate WLs, as also shown on FIG. 6, each of cells 302, 304, 306, 308, 310, 312, 314, and 316 will have a source voltage of 0 volts, a drain voltage of 5 volts, and a gate voltage −8 volts, the same as AC-memory device 100 of FIG. 2B. The voltage difference between source and gate is 8 volts and the voltage difference between drain and gate is 12.5V. At the large voltage difference between drain and gate holes flow from drain to gate. Again, the holes will compensate for electrons stored in the data side of the AC-memory cells.

Figure 7:
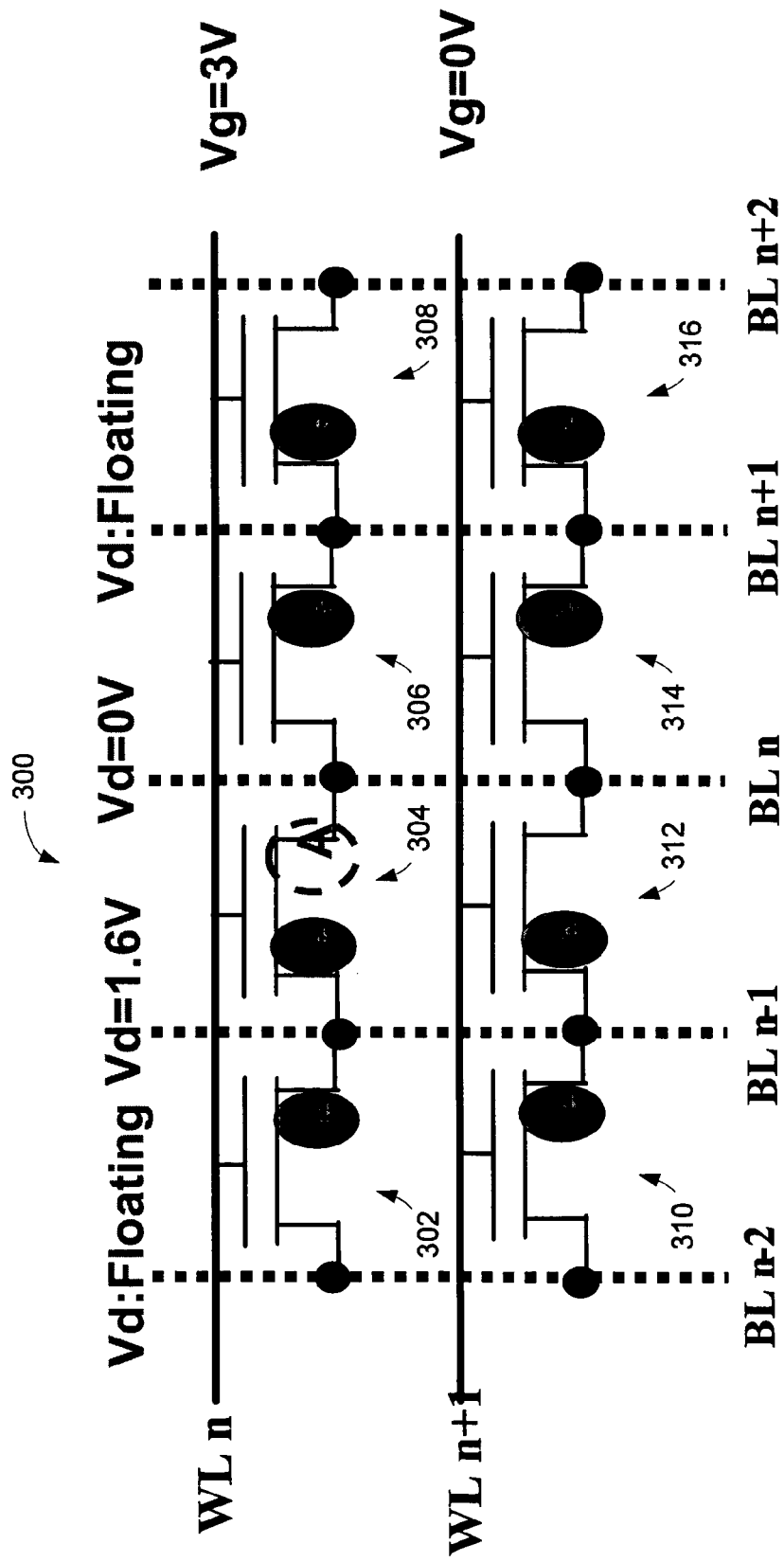
FIG. 7 is a diagram illustrating an example method for a read operation of the array of FIG. 3 in accordance with one embodiment.

FIG. 7 is a diagram illustrating an example read operation for array 300 in accordance with one embodiment of the systems and methods described herein. Individual cells can be read by applying certain voltages to the correct BLs and WLs, similar to the discussion of programming and erasing discussed with respect to FIGS. 5–6. The source, and/or drain of cells that are not being read can be allowed to float, as shown in FIG. 8.

For example, using $WL_n$, $BL_{n-1}$, and $BL_n$, AC-memory cell 302 can be read. In one implementation, the gate voltage on cell 302 can be 3 volts, the source voltage can be 1.6 volts, and the drain voltage can be 0 volts. In this way, current can flow when no charge is stored in the data-side of cell 302, while current will not flow, or at least be lower, when charge is stored in the data-side of cell 302. It will be understood that the actual source, drain and gate voltages needed to read a particular cell will vary based on the implementation, for example, the amount of charge that is stored in the AC-side of a cell can effect these voltage requirements.

In one embodiment little or no current can indicate one logic state, while a higher current flow can indicate another logic state. In such an embodiment two states can be stored in each memory cell. Alternatively, in another embodiment, different current levels can indicate multiple logic levels stored in each memory cell. For example, by storing various charge levels in the data-side of the cell 302 different logic states can be stored.

Figure 8:
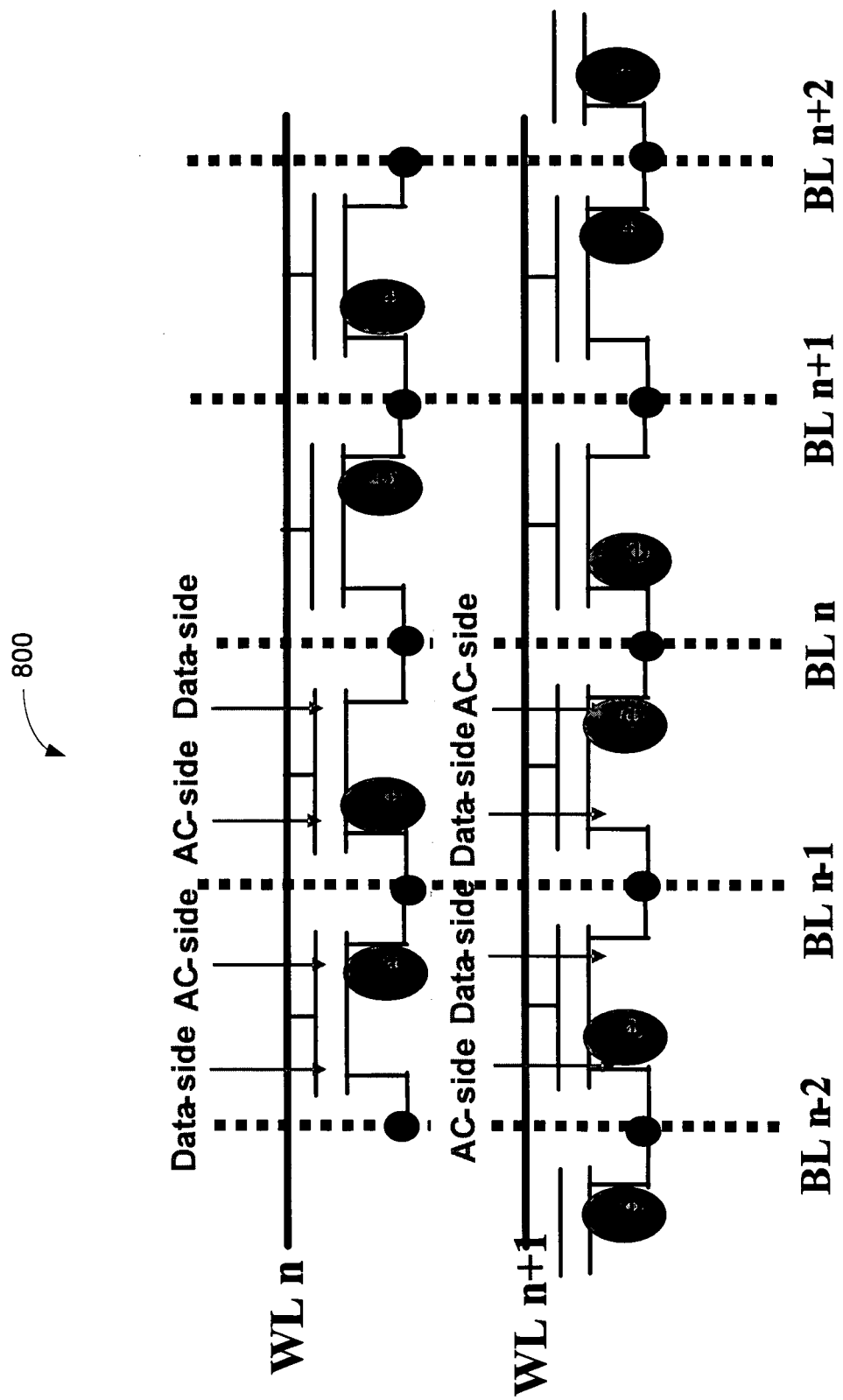
FIG. 8 is a diagram illustrating an example array of AC-memory cells in accordance with one embodiment.
Figure 9:
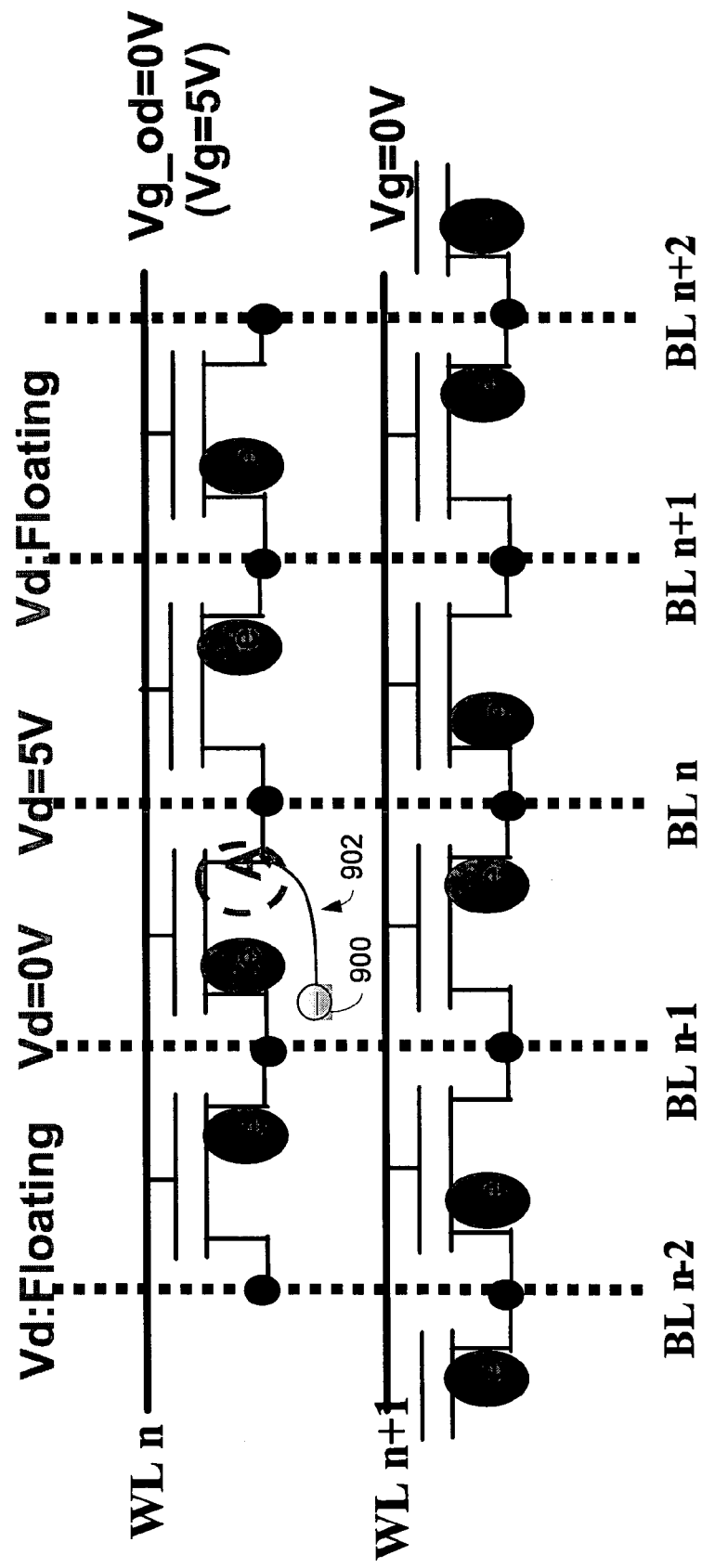
FIG. 9 is a diagram illustrating an example method for programming the array of FIG. 8 in accordance with one embodiment.
Figure 10:
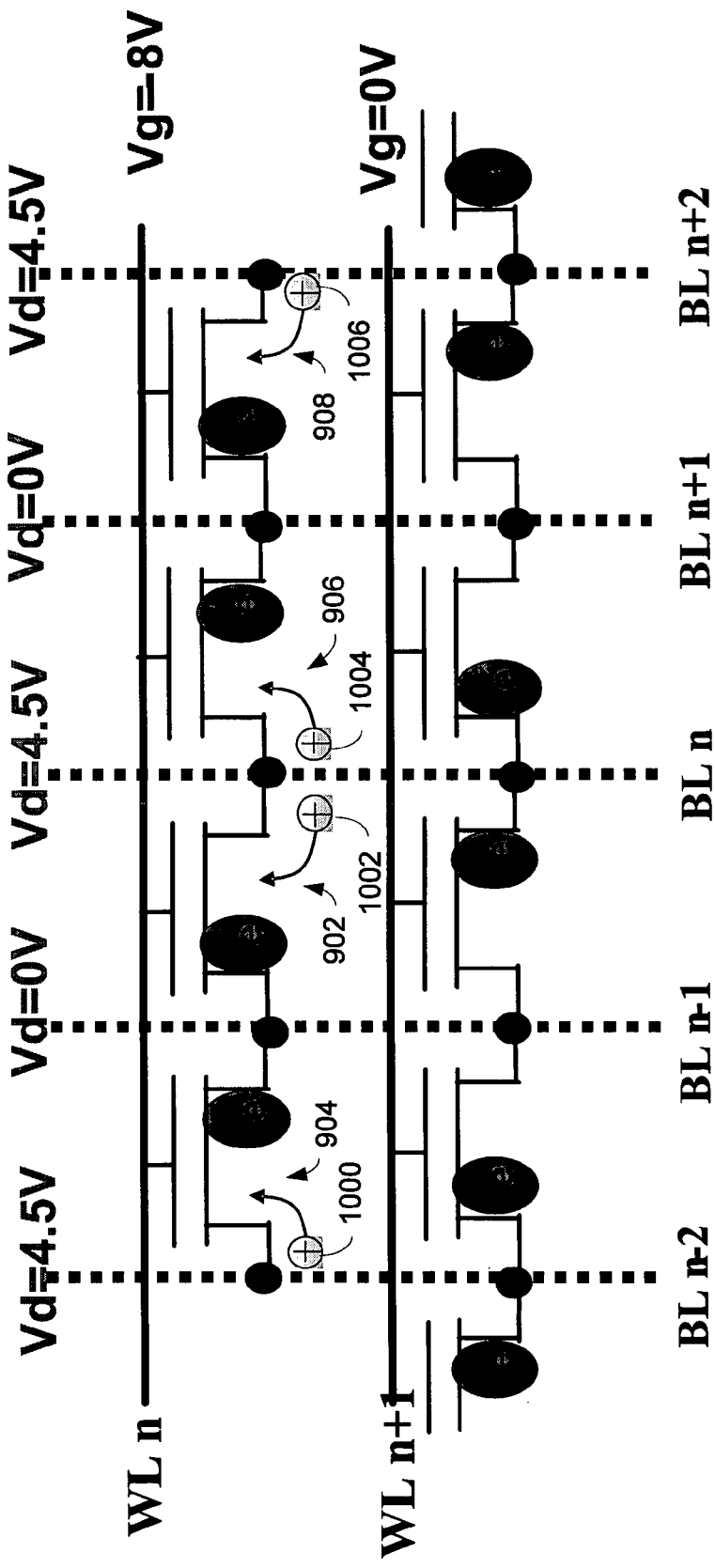
FIG. 10 is a diagram illustrating an example method for a sector or page erase of the array of FIG. 8 in accordance with one embodiment.
Figure 11:
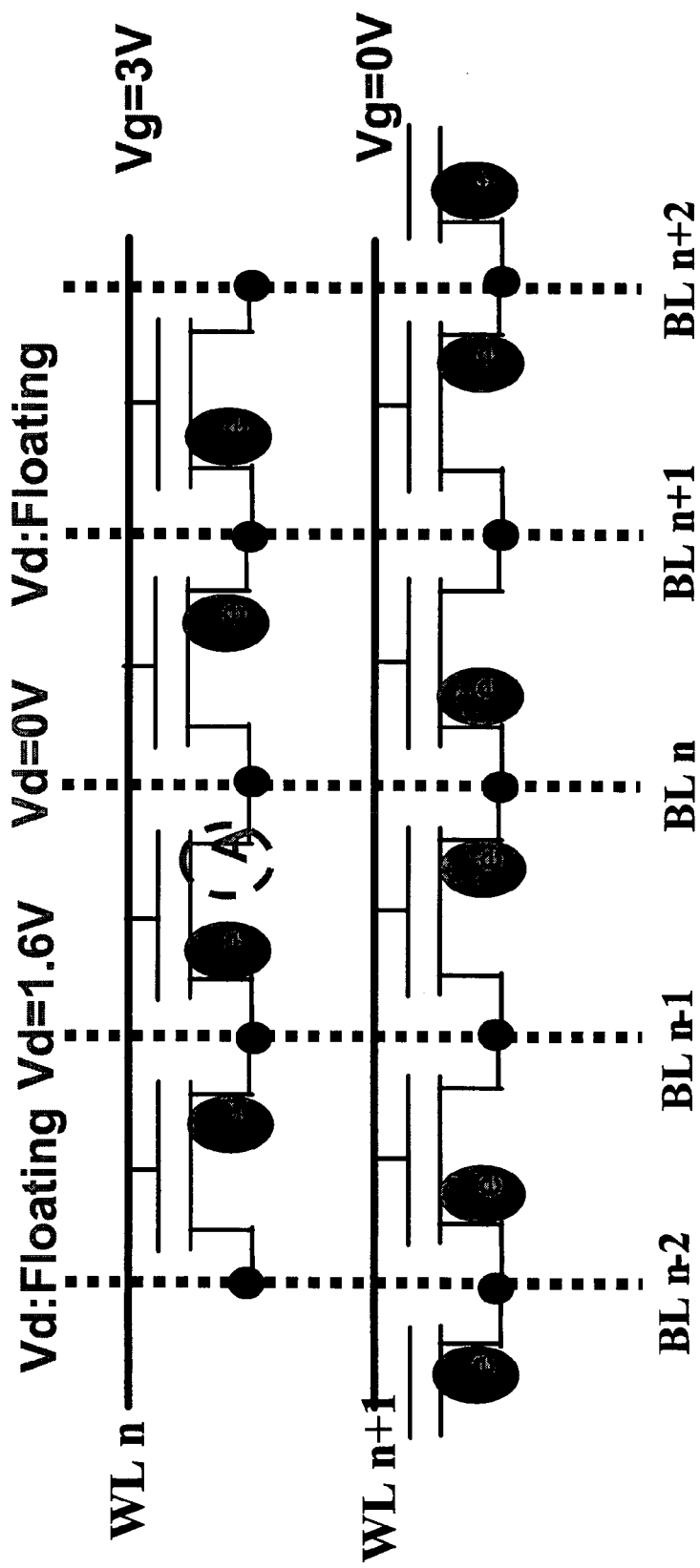
FIG. 11 is a diagram illustrating an example method for a read of the array of FIG. 8 in accordance with one embodiment.

FIG. 8 is a diagram illustrating an example array 800 of AC-memory cells configured in accordance with another embodiment of the systems and methods described herein. Array 800 is similar to array 300, except the assisted charges are around $BL_n$ are on alternate sides. As can be seen in FIGS. 9–11, programming, erasing, and reading can be performed similar to FIGS. 5, 6 and 7.

FIG. 9 is a diagram illustrating an example method for programming array 800 in accordance with one embodiment of the systems and methods described herein. Again, AC-memory cells within array 800 can be programmed individually, by applying certain voltages to the correct WLs and BLs. AC-memory cell 900 can, for example, be programmed by applying 0 volts to $BL_{n-1}$, 5 volts to $BL_n$ and 5 volts to $WL_n$. In this way, AC-memory cell 304 will have a source voltage of 0 volts, a drain voltage of 5 volts, and a gate voltage 5 volts, the same as AC-memory device 100 of FIG. 2A. As was described with respect to FIG. 2A, electrons 1002 can then start to flow from the source toward the drain and some electrons 902 will travel through the first oxide layer into the charge trapping layer on the data side of cell 304.

Other BLs can be allowed to float and a voltage of 0 volts can be driven on other WLs, so that little or no current will flow in the other cells during programming of cell 304. In this way, the other cells can remain un-programmed or retain a previously programmed value.

FIG. 10 is a diagram illustrating an example method for a page/sector erase similar to FIG. 6 above. Thus, AC-memory cells 902, 904, 906, and 908 can, for example, be erased by applying 0 or 4.5 volts to the correct BLs as shown on FIG. 10, and by applying −8 volts to the appropriate WLs, as also shown on FIG. 10. Each of AC-memory cells 902, 904, 906, and 908 will then have a source voltage of 0 volts, a drain voltage of 5 volts, and a gate voltage −8 volts, the same as AC-memory device 100 of FIG. 2B. The voltage difference between source and gate is 8 volts and the voltage difference between drain and gate is 12.5V. At the large voltage difference between drain and gate holes flow from drain to gate. Again, the holes can compensate for electrons stored in the data side of AC-memory cells 902, 904, 906, and 908.

FIG. 11 is a diagram illustrating an example method for a read of array 800 in accordance with one embodiment of the systems and methods described herein. Again, individual gates can be read by applying certain voltages to the correct BLs and WLs. The source, and/or drain of cells that are not being read can be allowed to float, as shown in the FIG. 11.

Thus, using $WL_n$, $BL_{n-1}$, and $BL_n$, AC-memory cell 1000 can be read. The gate voltage on cell 1000 can be 3 volts, the source voltage on cell 1000 can be 1.6 volts, and the drain voltage can be 0 volts. In this way, current can flow when no charge is stored in the data-side of cell 1000, while current will not flow, or at least be lower when charge is stored in the data-side of cell 1000. Again, it will be understood that the actual source, drain and gate voltages needed to read a particular cell will vary based on implementation, for example, the amount of charge that is stored in the AC-side of a cell.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A non-volatile memory array comprising a plurality of assisted charge memory cells, each of the plurality assisted charge memory cells comprising:
   an assisted charge side and a data side; and
   an abrupt electrical field region, formed by the assisted charge side and the data side of each of the plurality of assisted charge memory cells, the assisted charge memory cells arranged into pairs, wherein the assisted charge side for each assisted charge memory cell in a pair of assisted charge memory cells are adjacent.

2. The non-volatile memory array of claim 1, further comprising a plurality of bit lines and word lines, wherein the assisted charge memory cells are arrange into pairs around common bit lines for each row.

3. The non-volatile memory array of claim 1, further comprising a plurality of bit lines and word lines, wherein the assisted charge memory cells are arranged into pairs along alternate bit lines by row.

4. The non-volatile memory array of claim 1, further comprising a plurality of word lines and bit lines.

5. The non-volatile memory array of claim 4, wherein the plurality of word lines and bit lines are arranged such that each assisted charge memory cell can be programmed individually.

6. The non-volatile memory array of claim 4, wherein the plurality of word lines and bit lines are arranged such that each transistor can be erased by page.

7. The non-volatile memory array of claim 4, wherein the plurality of word lines and bit lines are arranged such that each transistor can be erased by sector.

8. The non-volatile memory array of claim 1, wherein each of the plurality of assisted memory cells further comprises:
   a silicon substrate;
   a drain region formed in the substrate;
   a source region formed in the substrate; and
   a trapping structure.

9. The non-volatile memory array of claim 8, wherein the trapping structure comprises an Oxide-Nitride-Oxide Layer formed on the substrate between the source and drain regions.

10. The non-volatile memory array of claim 8, wherein the non-volatile memory array is configured as a FLASH memory.

11. A non-volatile memory array comprising:
    a plurality of bit lines;
    a plurality of word lines; and
    a plurality of assisted charge memory cells, each of the plurality of assisted charge memory cells comprising:
       an assisted charge side and a data side; and
       an abrupt electrical field region, formed by the assisted charge side and the data side of each of the plurality of assisted charge memory cells, the assisted charge memory cells arranged into pairs around common bit lines for each row, wherein the assisted charge side for each assisted charge memory cell in a pair of assisted charge memory cells are adjacent.

12. The non-volatile memory array of claim 11, wherein the plurality of word lines and bit lines are arranged such that each assisted charge memory cell can be programmed individually.

13. The non-volatile memory array of claim 11, wherein the plurality of word lines and bit lines are arranged such that each assisted charge memory cell can be erased individually.

14. The non-volatile memory array of claim 11, wherein the plurality of word lines and bit lines are arranged such that each assisted charge memory cell can be erased by page.

15. The non-volatile memory array of claim 11, wherein the plurality of word lines and bit lines are arranged such that each assisted charge memory cell can be erased by sector.

16. A non-volatile memory array comprising:
    a plurality of bit lines;
    a plurality of word lines; and
    a plurality of assisted charge memory cells, each of the plurality of assisted charge memory cells comprising:
       an assisted charge side and a data side; and
       an abrupt electrical field region, formed by the assisted charge side and the data side of each of the plurality of assisted charge memory cells, the assisted charge memory cells arranged into pairs around alternating bit lines by row, wherein the assisted charge side for assisted charge memory cell in a pair of assisted charge memory cells are adjacent.

17. The non-volatile memory array of claim 16, wherein the plurality of word lines and bit lines are arranged such that each assisted charge memory cell can be programmed individually.

18. The non-volatile memory array of claim 16, wherein the plurality of word lines and bit lines are arranged such that each assisted charge memory cell can be erased individually.

19. The non-volatile memory array of claim 16, wherein the plurality of word lines and bit lines are arranged such that each assisted charge memory cell can be erased by page.

20. The non-volatile memory array of claim 16, wherein the plurality of word lines and bit lines are arranged such that each assisted charge memory cell can be erased by sector.

* * * * *